(12) United States Patent
Choi et al.

(10) Patent No.: US 9,185,760 B1
(45) Date of Patent: Nov. 10, 2015

(54) ALTERNATING CURRENT (AC) LINE VOLTAGE DETERMINATION

(71) Applicant: Marvell International Ltd., Hamilton (BM)

(72) Inventors: Jinho Choi, Saratoga, CA (US); Hao Peng, Sunnyvale, CA (US); Wanfeng Zhang, Palo Alto, CA (US); Tuyen Doan, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 248 days.

(21) Appl. No.: 13/648,455

(22) Filed: Oct. 10, 2012

Related U.S. Application Data

(60) Provisional application No. 61/546,950, filed on Oct. 13, 2011.

(51) Int. Cl.
| H05B 33/02 | (2006.01) |
| H05B 33/08 | (2006.01) |
| H02M 3/335 | (2006.01) |

(52) U.S. Cl.
CPC ....... *H05B 33/0824* (2013.01); *H02M 3/33507* (2013.01); *H05B 33/0884* (2013.01)

(58) Field of Classification Search
None
See application file for complete search history.

(56) References Cited

U.S. PATENT DOCUMENTS

| 3,836,854 | A | * | 9/1974 | Wehman | 324/133 |
| 4,610,023 | A | * | 9/1986 | Noso et al. | 704/233 |
| 4,855,722 | A | * | 8/1989 | Mostyn et al. | 340/660 |
| 5,450,029 | A | * | 9/1995 | Jacobs et al. | 327/348 |
| 6,081,768 | A | * | 6/2000 | Hu et al. | 702/66 |
| 6,243,652 | B1 | * | 6/2001 | Fawcett et al. | 702/65 |
| 7,352,220 | B2 | * | 4/2008 | Heikkila | 327/175 |
| 8,111,050 | B2 | * | 2/2012 | Sutardja et al. | 323/207 |
| 8,143,866 | B2 | * | 3/2012 | Fagnani et al. | 323/222 |
| 8,324,840 | B2 | * | 12/2012 | Shteynberg et al. | 315/308 |
| 8,704,455 | B2 | * | 4/2014 | Choi et al. | 315/291 |
| 8,766,550 | B1 | * | 7/2014 | Yoon et al. | 315/200 R |
| 9,042,124 | B1 | * | 5/2015 | Choi et al. | 363/20 |

* cited by examiner

*Primary Examiner* — Alexander H Taningco
*Assistant Examiner* — Nelson Correa

(57) ABSTRACT

In various embodiments, there is provided a method comprising receiving a waveform; rectifying the waveform to generate a rectified waveform; comparing the rectified waveform with a first voltage to generate a first compare signal, wherein a first edge of the first compare signal occurs at a first time when an instantaneous value of the rectified waveform becomes higher than the first voltage; comparing the rectified waveform with a second voltage to generate a second compare signal, wherein a first edge of the second compare signal occurs at a second time when the instantaneous value of the rectified waveform becomes higher than the second voltage; and based at least in part on the first time and the second time, estimating a voltage of the waveform.

22 Claims, 5 Drawing Sheets

ALTERNATING CURRENT (AC) LINE VOLTAGE DETERMINATION

CROSS-REFERENCES TO RELATED APPLICATIONS

The present disclosure claims priority to U.S. Provisional Patent Application No. 61/546,950, filed on Oct. 13, 2011, which is incorporated herein by reference.

TECHNICAL FIELD

Embodiments of the present disclosure relate to the field of alternating current (AC) line voltage, and more particularly, to determination of AC line voltage.

BACKGROUND

Unless otherwise indicated herein, the approaches described in this section are not prior art to the claims in the present disclosure and are not admitted to be prior art by inclusion in this section.

Various regions of the world have various standards for supplying alternating current (AC) power to households and end users. For example, in the United States of America (USA), 120 volts (V), 60 Hertz (Hz) AC power is usually supplied, while several European countries supply 230 V, 50 Hz AC power.

An electronic appliance may be intended to be used across several countries of the world. Such an electronic appliance needs to be compatible with different AC power standards existing in different countries. To be operable in different countries having different standards of AC power, the electronic appliance may need to identify AC power standard that is being used to supply the electronic appliance with power.

SUMMARY

In various embodiments, there is provided a method comprising receiving a waveform; rectifying the waveform to generate a rectified waveform; comparing the rectified waveform with a first voltage to generate a first compare signal, wherein a first edge of the first compare signal occurs at a first time when an instantaneous value of the rectified waveform becomes higher than the first voltage; comparing the rectified waveform with a second voltage to generate a second compare signal, wherein a first edge of the second compare signal occurs at a second time when the instantaneous value of the rectified waveform becomes higher than the second voltage; and based at least in part on the first time and the second time, estimating a voltage of the waveform. Estimating the voltage of the waveform further comprises based at least in part on the first time and the second time, determining a voltage estimation factor; comparing the voltage estimation factor with a threshold value; and based at least in part on comparing the voltage estimation factor with the threshold value, estimating the voltage of the waveform. Estimating the voltage of the waveform further comprises in response to the voltage estimation factor being higher than the threshold value, estimating that a root mean square (RMS) value of the waveform is lower than a threshold voltage. Estimating the voltage of the waveform further comprises in response to the voltage estimation factor being lower than the threshold value, estimating that a root mean square (RMS) value of the waveform is higher than a threshold voltage. In an embodiment, the method further comprises based at least in part on estimating the waveform, controlling power to a light emitting diode (LED).

There is also provided a circuit comprising a rectifier circuit to receive a waveform, rectify the waveform and generate a rectified waveform; a first comparison module configured to compare the rectified waveform with a first voltage to generate a first compare signal, wherein a first edge of the first compare signal occurs at a first time when an instantaneous value of the rectified waveform becomes higher than the first voltage; a second comparison module configured to compare the rectified waveform with a second voltage to generate a second compare signal, wherein a first edge of the second compare signal occurs at a second time when the instantaneous value of the rectified waveform becomes higher than the second voltage; and a voltage estimation module configured to, based at least in part on the first time and the second time, estimate a voltage of the waveform. The voltage estimation module is configured to estimate the voltage of the waveform by based at least in part on the first time and the second time, determining a voltage estimation factor; comparing the voltage estimation factor with a threshold value; and based at least in part on comparing the voltage estimation factor with the threshold value, estimating the voltage of the waveform. The voltage estimation module is further configured to estimate the voltage of the waveform by in response to the voltage estimation factor being higher than the threshold value, estimating that a root mean square (RMS) value of the waveform is lower than a threshold voltage. The voltage estimation module is further configured to estimate the voltage of the waveform by in response to the voltage estimation factor being lower than the threshold value, estimating that a root mean square (RMS) value of the waveform is higher than a threshold voltage. In an embodiment, the circuit is included in a control circuit of a light emitting diode (LED).

There is also provided a method comprising receiving a periodically varying waveform; rectifying the periodically varying waveform to generate a rectified waveform; selecting a first value for a first voltage and a second value for a second voltage; based on selecting the first value for the first voltage, comparing the rectified waveform with the first voltage to generate a first compare signal; based on selecting the second value for the second voltage, comparing the rectified waveform with the second voltage to generate a second compare signal; based at least in part on the first compare signal and the second compare signal, estimating a root mean square (RMS) value of the periodically varying waveform; and in response to estimating the RMS value of the periodically varying waveform, selecting a third value for the first voltage and a fourth value for the second voltage.

BRIEF DESCRIPTION OF THE DRAWINGS

Embodiments will be readily understood by the following detailed description in conjunction with the accompanying drawings. Embodiments are illustrated by way of example and not by way of limitation in the figures of the accompanying drawings.

DETAILED DESCRIPTION OF DISCLOSED EMBODIMENTS

Figure 1:
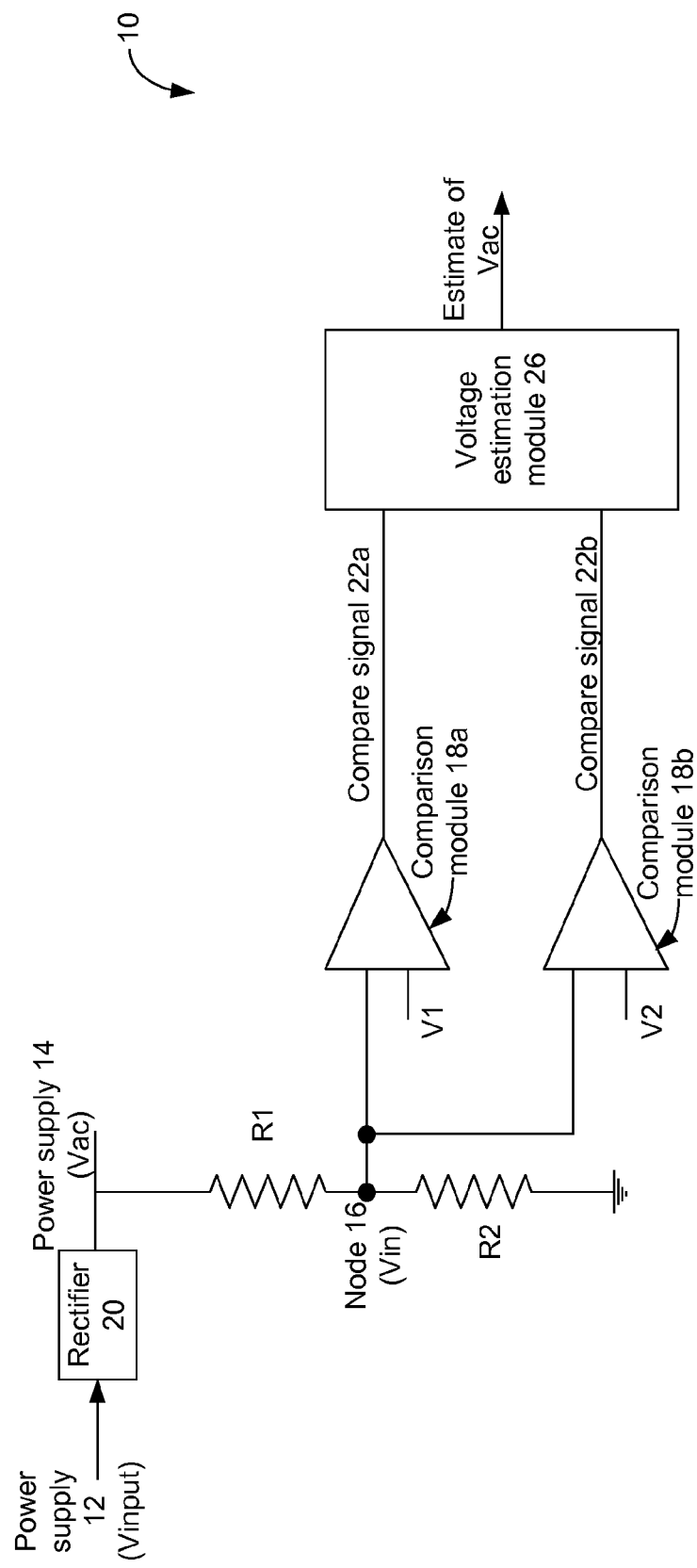
FIG. 1 illustrates a system for estimating a voltage of a power supply, in accordance with various embodiments.

FIG. 1 illustrates a system 10 for estimating a voltage of a power supply 12, in accordance with various embodiments. In an embodiment, the system 10 is incorporated in a control circuit of a light emitting diode (LED) lamp, although the system 10 may be incorporated in any other electronic device as well.

The power supply 12 has a voltage Vinput that has a periodically varying waveform. For example, the voltage Vinput is an alternating current (AC) voltage having a substantially sinusoidal waveform. In an embodiment, the voltage Vinput (e.g., a magnitude, a root mean square (RMS) value, and/or a frequency of the voltage Vac) is not known a-priori to the system 10. In an embodiment, the power supply 12 is rectified by a rectifier 20 to generate a power supply 14 having a voltage Vac. The rectifier 12 is, for example, a full wave rectifier. In an embodiment, the system 10 estimates the voltage Vac (e.g., a magnitude, a RMS value, and/or a frequency of the voltage Vac), based on which the voltage Vinput is estimated.

In an embodiment, the system 10 comprises resistors R1 and R2 coupled in series between the power supply 14 and a ground node, as illustrated in FIG. 1. The resistors R1 and R2 form a voltage divider. A node 16 between the resistors R1 and R2 is at a voltage Vin that is proportional to the voltage Vac of the power supply 14. For example, the voltage Vac can be determined if the voltage Vin is known (e.g., assuming that the resistances of the resistors R1 and R2 are known). Values of the resistors R1 and R2 can be selected appropriately to control the voltage Vin of the node 16.

The system 10 further comprises (i) a comparison module 18a configured to compare the voltage Vin of the node 16 with a voltage V1, and (ii) a comparison module 18b configured to compare the voltage Vin of the node 16 with a voltage V2. In an embodiment, the voltages V1 and V2 are direct current (DC) voltages, i.e., have substantially constant values. Each of the comparison modules 18a and 18b may be any appropriate type of comparison modules configured to compare two voltages.

The comparison modules 18a and 18b respectively output compare signals 22a and 22b, based on comparison operations performed by a respective comparison module. For example, if an instantaneous value of the voltage Vin is higher than the voltage V1, the comparison module 18a outputs a logical high value of the compare signal 22a; and if an instantaneous value of the voltage Vin is lower than the voltage V1, the comparison module 18a outputs a logical low value of the compare signal 22a. However, in another example, the comparison module 18a can act in an opposite manner (e.g., if the instantaneous value of the voltage Vin is higher than the voltage V1, the comparison module 18a can output a logical low value of the compare signal 22a, and vice versa).

Similarly, if the instantaneous value of the voltage Vin is higher than the voltage V2, the comparison module 18b outputs a logical high value of the compare signal 22b; and if the instantaneous value of the voltage Vin is lower than the voltage V2, the comparison module 18b outputs a logical low value of the compare signal 22b (although in another example, the comparison module 18a can act in an opposite manner as well).

The system 10 further comprises a voltage estimation module 26 configured to receive the compare signals 22a and 22b. Based on the compare signals 22a and 22b, the voltage estimation module 26 is configured to estimate the voltage Vac (e.g., estimate the RMS value of the voltage Vac).

Figure 2:
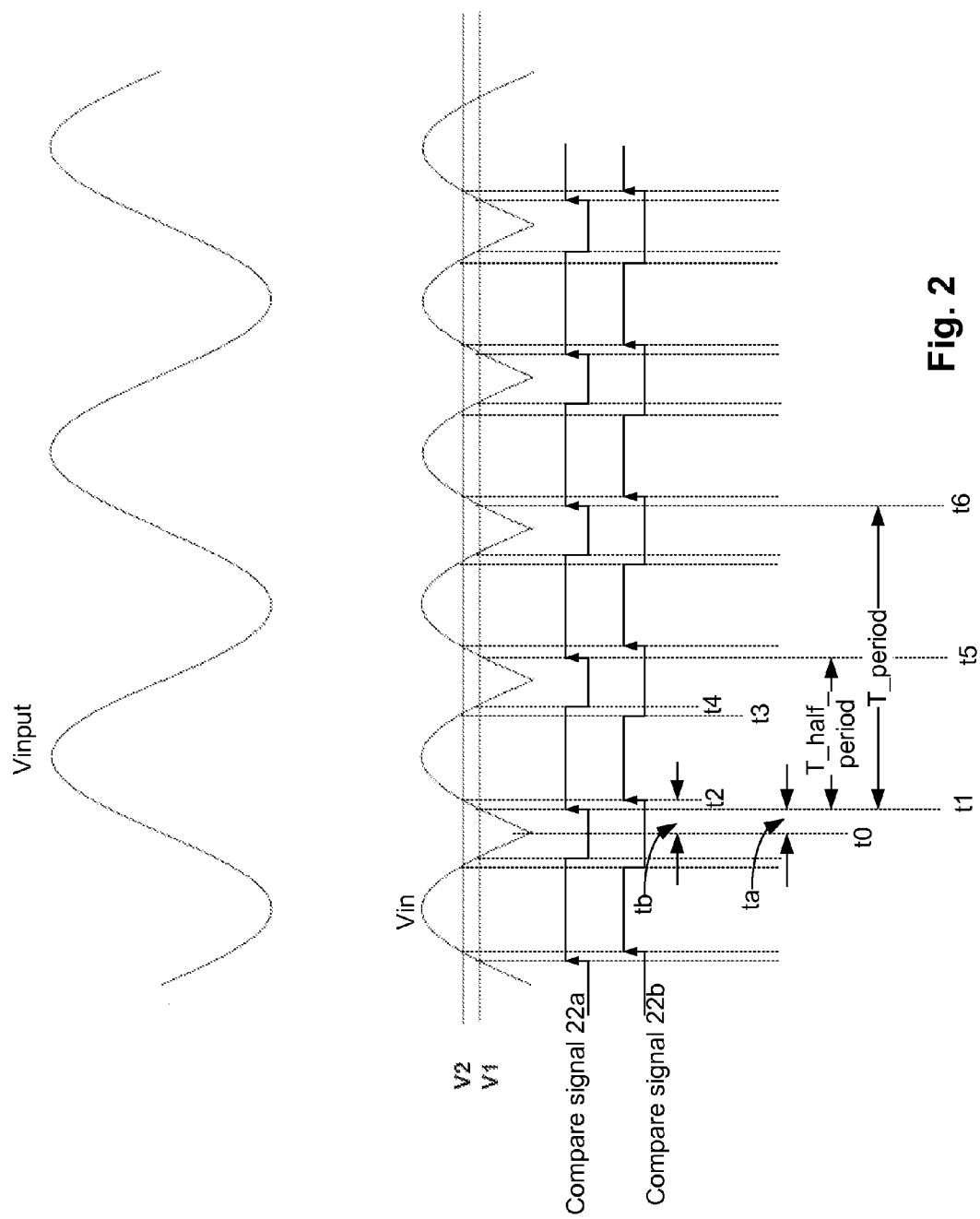
FIG. 2 illustrates an example of a timing diagram of various signals of the system of FIG. 1, in accordance with various embodiments.

FIG. 2 illustrates an example of a timing diagram of various signals of the system 10, in accordance with various embodiments. Specifically, FIG. 2 illustrates the voltages Vinput, Vin (which is proportional to the voltage Vac, where Vac is the rectified version of the voltage Vinput, as rectified by the rectifier 20), V1 and V2, and the compare signals 22a and 22b. As previously discussed and as illustrated in FIG. 2, voltages V1 and V2 have substantially constant values, whereas the voltage Vin is a rectified sinusoidal AC voltage. In the example of FIG. 2, voltage V2 has a higher value compared to the voltage V1.

FIG. 2 illustrates a few cycles of the voltage Vin. Time t0 in FIG. 2 indicates a time when the voltage Vin has a lowest instantaneous value. It is to be noted that as a waveform of the voltage Vin is unknown to the voltage estimation module 26, the voltage estimation module 26 may not have prior knowledge of the time t0. A time period of the voltage Vin is labeled as T_half_period, which is equal to half of a time period of the sinusoidal voltage Vinput. The time period T_period labeled in FIG. 2 is equal to two time periods of the voltage Vin (i.e., T_period=2×T_half_period). The time period T_period labeled in FIG. 2 is the time period of the sinusoidal voltage Vinput, and is a reciprocal to a frequency f of the sinusoidal voltage Vinput.

During time t0 (e.g., while the voltage Vin has lowest instantaneous value), as the instantaneous value of the voltage Vin is less than the voltages V1 and V2, the compare signals 22a and 22b are both low. At time t1 (which occurs subsequent to time t0), the instantaneous value of the voltage Vin crosses the voltage V1, and accordingly, the compare signal 22a transitions to a high value (labeled using an upward pointing arrow, indicating a rising edge of the compare signal 22a), as illustrated in FIG. 2. The time period between time t0 and time t1 is labeled as time period ta. At time t2 (which occurs subsequent to time t1), the instantaneous value of the voltage Vin crosses the voltage V2, and accordingly, the compare signal 22b transitions to a high value (labeled using an upward pointing arrow, indicating a rising edge of the compare signal 22b), as also illustrated in FIG. 2. The time period between time t0 and time t2 is labeled as time period tb. That is, the compare signals 22a and 22b transition to the respective higher values at times t1 and t2, respectively. As the voltage V2 is higher than the voltage V1, the compare signal 22a transitions to the higher value earlier than the transition of the compare signal 22b to the higher value (i.e., time t1 occurs prior to time t2).

At times t3 and t4, the compare signals 22b and 22a respectively transition to low values, based on the instantaneous value of the voltage Vin becoming less than the voltages V2 and V1, respectively. Thus, as illustrated in FIG. 2, the compare signals 22a and 22b have substantially rectangular waveform, based on the voltages V1, V2 and Vinput.

The voltage V1 is associated with the voltage Vinput and the time period ta as follows:

$$V1 = \sqrt{2} \cdot V_{input\_RMS} \cdot \sin(2\pi f \cdot ta), \quad \text{Equation (1)}$$

where $V_{input\_RMS}$ is the RMS value of the voltage Vinput and f is the frequency (e.g., in Hz) of the voltage Vinput. It is to be noted that Equation 1 (and one or more subsequent equations) does not take into account the voltage divider comprising resistors R1 and R2, e.g., assumes R1=0. However, the voltage divider can be taken into account by merely scaling Equation 1 with a scaling factor that is based on the values of the resistors R1 and R2, as would be readily understood by those skilled in the art based on the teachings of this disclosure. Equation 1 can be simplified as:

$$ta = \frac{T\_period}{2\pi} \sin^{-1}\left(\frac{V1}{\sqrt{2} \times V_{input\_RMS}}\right). \quad \text{Equation (2)}$$

Similarly, the time period tb can be determined as:

$$tb = \frac{T\_period}{2\pi} \sin^{-1}\left(\frac{V2}{\sqrt{2} \times V_{input\_RMS}}\right). \quad \text{Equation (3)}$$

Equations 2 and 3 can be combined and simplified as follows:

$$\frac{ta - tb}{T\_period} = \frac{1}{2\pi}\left[\sin^{-1}\left(\frac{V1}{\sqrt{2} \times V_{input\_RMS}}\right) - \sin^{-1}\left(\frac{V2}{\sqrt{2} \times V_{input\_RMS}}\right)\right]. \quad \text{Equation (4)}$$

In an embodiment, the voltage estimation module 26 receives the compare signals 22a and 22b, and identifies the time t1 and time t2 (e.g., the times t1 and t2 correspond to two consecutive rising edges of the compare signals 22a and 22b, respectively). As the time t0 is unknown (e.g., as the system 10 is unaware of when the voltage Vin has the lowest instantaneous value), the voltage estimation module 26 cannot determine the time periods ta and tb. However, based on receiving the compare signals 22a and 22b, the voltage estimation module 26 can determine the difference in time periods ta and tb (i.e., determine (ta–tb)), e.g., by determining the difference between the two consecutive rising edges of the compare signals 22a and 22b (i.e., (ta–tb) is equal to (t2–t1)). Furthermore, two consecutive rising edges of the compare signal 22a (or the compare signal 22b) also correspond to a full cycle of the voltage Vin (labeled as T_half_period). Accordingly, the voltage estimation module 26 can also determine the time period T_half_period of the voltage Vin by determining the time between two consecutive rising edges of the compare signal 22a (or two consecutive rising edges of the compare signal 22b), as illustrated in FIG. 2. From T_half_period, the voltage estimation module 26 can also determine the time period T_period (e.g., as T_period=2× T_half_period). Put differently, the voltage estimation module 26 can determine (ta–tb) and also determine the time period T_period.

As the voltage Vinput is a sinusoidal waveform, the time period T_period does not change with time (e.g., unless the frequency of the voltage Vin changes with time). Thus, for a given value of the voltages V1 and V2, the factor (ta–tb)/T_period is based on the RMS value of the voltage Vinput (e.g., as illustrated in Equation 4). The factor (ta–tb)/T_period is also referred to herein as a voltage estimation factor.

Figure 3:
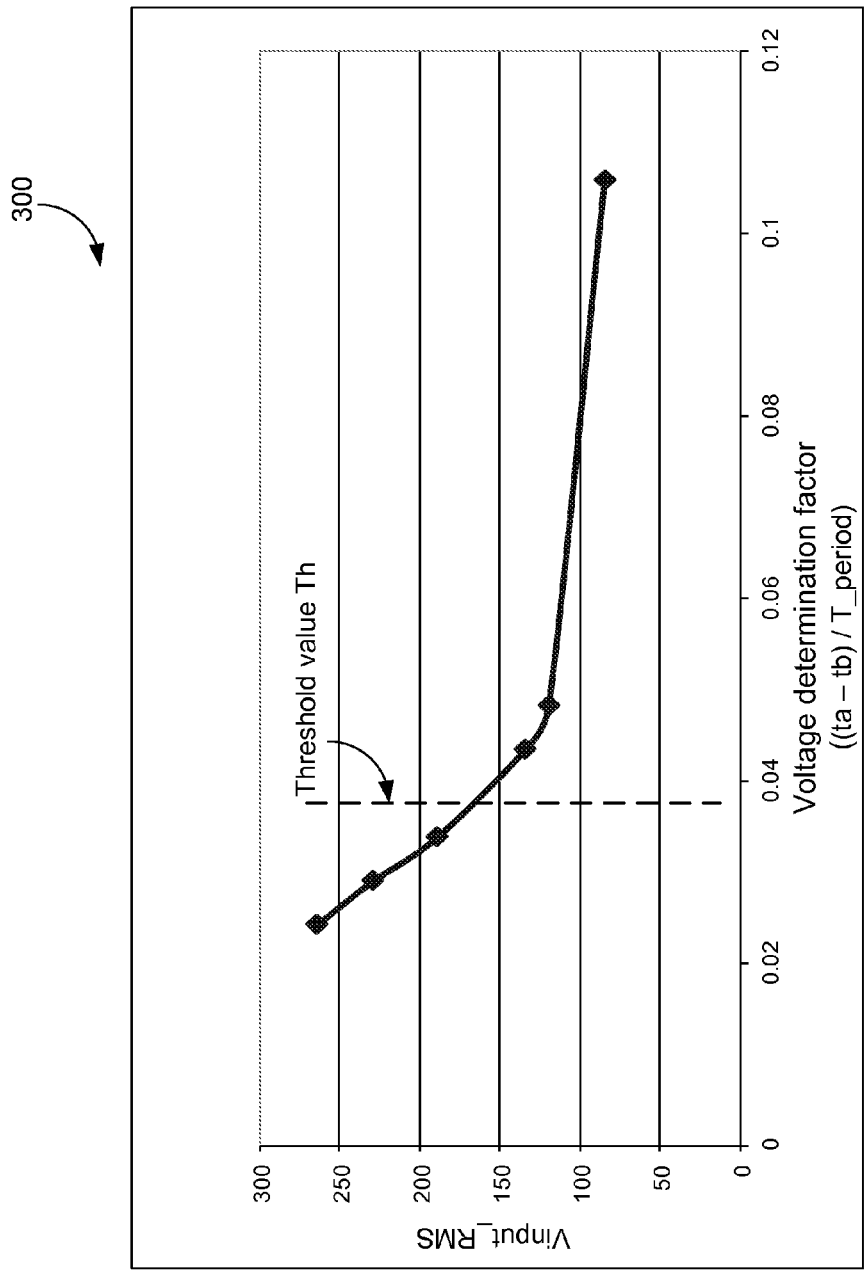
FIG. 3 illustrates a graph of an example variation of a voltage estimation factor with the voltage of the power supply of FIG. 1, in accordance with various embodiments.

FIG. 3 illustrates a graph 300 of an example variation of the voltage estimation factor (ta–tb)/T_period with the RMS value of the voltage Vinput, in accordance with various embodiments. The graph 300 has been plotted using respective constant values of the voltages V1 and V2. The voltage Vinput has been varied; and for each RMS value of the voltage Vinput, the voltage estimation factor (ta–tb)/T_period has been determined and plotted. The Y axis of the graph 300 corresponds to example RMS values of the voltage Vinput, and the X axis corresponds to the corresponding variations in the voltage estimation factor (ta–tb)/T_period.

As illustrated in FIG. 3, for relatively higher RMS values of the voltage Vinput, the voltage estimation factor (ta–tb)/T_period is relatively less. On the other hand, for relatively lower RMS values of the voltage Vinput, the voltage estimation factor (ta–tb)/T_period is relatively high.

FIG. 3 also illustrates a threshold value Th. In an embodiment, the voltage estimation module 26 receives the compare signals 22a and 22b and determines the voltage estimation factor (ta–tb)/T_period. The voltage estimation factor (ta–tb)/T_period being higher than the threshold value Th indicates that the RMS value of the voltage Vinput is relatively low (e.g., lower than a threshold voltage); while the voltage estimation factor (ta–tb)/T_period being lower than the threshold value Th indicates that the RMS value of the voltage Vinput is relatively high (e.g., higher than the threshold voltage). Accordingly, the voltage estimation module 26 provides an estimation of the RMS value of the voltage Vinput, i.e., whether the RMS value of the voltage Vinput is relatively high or relatively low. In the example graph 300 of FIG. 3, the threshold voltage is about 160 V.

Although FIG. 3 illustrates only one threshold value Th that can be used to determine whether the RMS value of the voltage Vinput is relatively high or relatively low, in an embodiment, more than one threshold value can be used to estimate the RMS value of the voltage Vinput. For example, two threshold values may be used to classify the RMS value of the voltage Vinput in a relatively high range, a relatively medium range, or a relatively low range.

Figure 4:
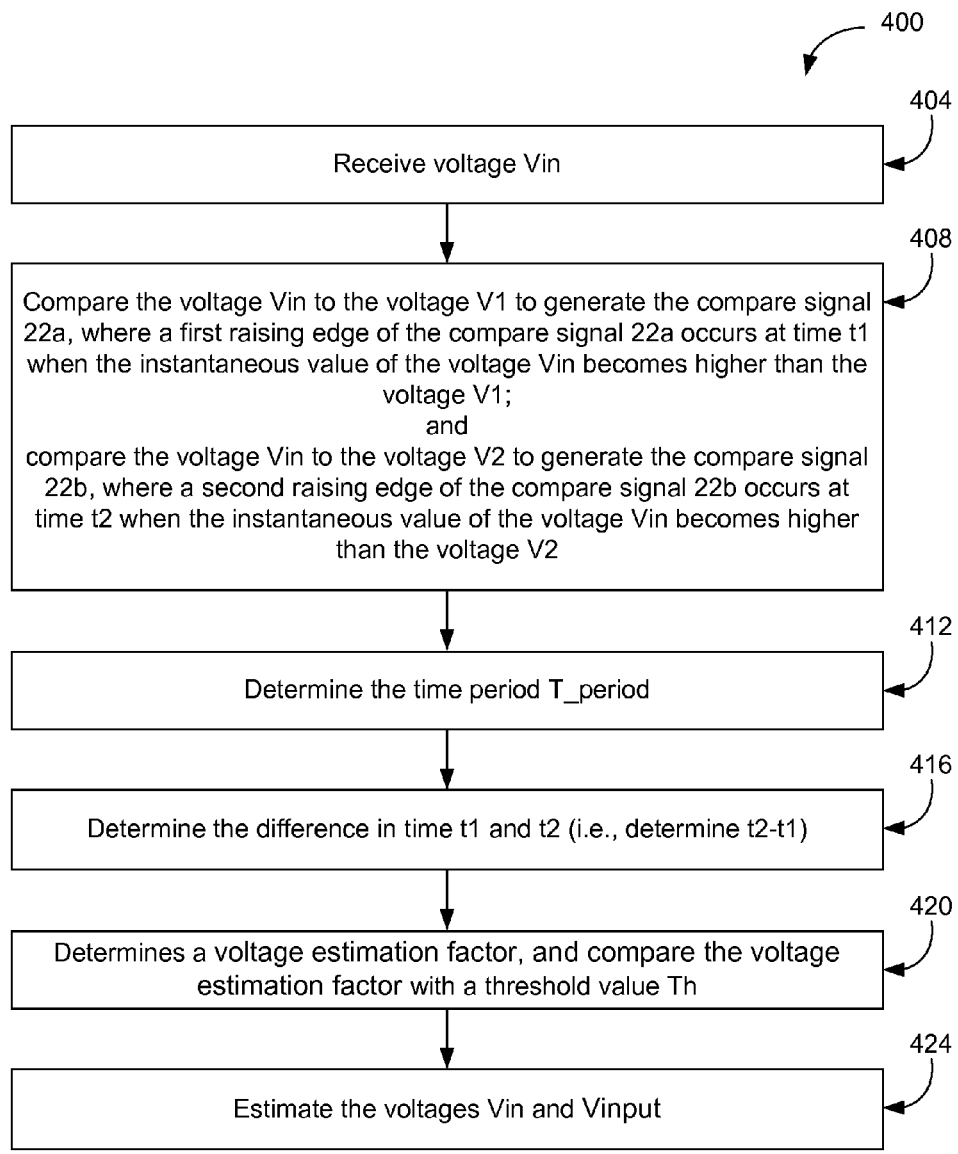
FIG. 4 illustrates an example of a method for estimating the voltage of the power supply of FIG. 1, in accordance with various embodiments.

FIG. 4 illustrates an example of a method 400 for estimating the voltage Vinput of the power supply 12, in accordance with various embodiments. At 404, the voltage Vin is received, for example, by the comparison modules 18a and 18b. The voltage Vin is generated from the voltage Vinput, as illustrated in FIG. 1.

At 408, the voltage Vin is compared (e.g., by the comparison module 18a) to the voltage V1 to generate the compare signal 22a. The compare signal 22a comprises a substantially rectangular waveform. A first rising edge of the compare signal 22a occurs at time t1, when the instantaneous value of the voltage Vin becomes higher than the voltage V1. Also at 408, the voltage Vin is compared (e.g., by the comparison module 18b) to the voltage V2 to generate the compare signal 22b. The compare signal 22b comprises a substantially rectangular waveform. A second rising edge of the compare signal 22b occurs at time t2, when the instantaneous value of the voltage Vin becomes higher than the voltage V2. The first rising edge and the second rising edge are two consecutive rising edges of the compare signals 22a and 22b, i.e., there are no intermediate rising edges of the compare signals 22a and 22b between the first rising edge and the second rising edge, as illustrated in FIG. 2.

At 412, the period T_period is determined (e.g., by the voltage estimation module 26). The period T_period is a duration of two cycles of the voltage Vin. The period T_period of the voltage Vin can be determined by, for example, measuring the time between two consecutive rising edges of the compare signal 22a (or two consecutive rising edges of the compare signal 22b), i.e., by measuring T_half_period, and multiplying the T_half_period by two.

At 416, the difference in time t1 and t2 is determined (i.e., (t2−t1) is determined), e.g., by the voltage estimation module 26. The time difference (t2−t1) is an indication of the difference in time period (tb−ta), as discussed with respect to FIG. 2. At 420, the voltage estimation factor (t2−t1)/T_period is determined and compared with the threshold value Th, e.g., by the voltage estimation module 26.

At 424, based on the comparison, the voltages Vin and Vinput are estimated. For example, the voltage estimation factor being higher than the threshold value Th indicates that the RMS value of the voltage Vinput is relatively low; while the voltage estimation factor being lower than the threshold value Th indicates that the RMS value of the voltage Vinput is relatively high, as discussed with respect to FIG. 3.

There are several advantages of estimating the voltage Vinput, in accordance with the method 400 of FIG. 4. For example, as previously discussed, various regions of the world have various standards for supplying alternating current (AC) line power to end users. For example, in the USA, 120 V, 60 Hz AC power is usually used, while several European countries use 230 V, 50 Hz AC power. The method 400 of FIG. 4 estimates whether the RMS value of the voltage Vinput is relatively low or relatively high. For example, if the RMS value of the voltage Vinput is estimated to be relatively low, then the system 10 may identify the power supply 14 to be a 120 V, 60 Hertz power supply (e.g., the kind of power supply used in the USA). On the other hand, if the RMS value of the voltage Vinput is estimated to be relatively high, then the system 10 may identify the power supply 14 to be a 230 V, 50 Hertz power supply (e.g., the kind of power supply used in various European countries). In an embodiment, the system 10 estimates the voltage Vinput during start-up, or when the power supply 14 is disconnected and then reconnected to the system 10 (e.g., as the power supply 14 cannot change from, for example, being a 120 V, 60 Hz supply to a 230 V, 50 Hz supply while the system 10 is operational).

In an embodiment, the system 10 is incorporated in a control circuit of an LED lamp, and such an identification of the AC line voltage Vinput is used to regulate power to the LED lamp.

Although the method 400 is directed towards estimating whether the RMS value of the voltage Vinput is relatively high or low, in another embodiment, the voltage estimation factor can also be used to estimate the RMS value of the voltage Vinput (e.g., using the graph 300 of FIG. 3, or using Equation 4).

FIGS. 1 and 2 illustrate rectifying the voltage Vinput and comparing the rectified voltage (or a scaled version of the rectified voltage) to the voltages V1 and V2 to estimate the voltage Vinput. However, although not illustrated in any of the figures, in another embodiment, the voltage Vinput (or a scaled version of the voltage Vinput) can be directly compared to the voltages V1 and V2 to estimate the voltage Vinput (i.e., the rectifier 20 will be redundant in such an embodiment). In such an embodiment, based on comparing the voltage Vinput with the voltages V1 and V2, corresponding compare signals 22a and 22b may be generated, which may be used to estimate the voltage Vinput, as will be readily understood by those skilled in the art based on the teachings of this disclosure.

In an embodiment and referring again to FIGS. 1 and 2, the voltages V1 and V2 can have various possible values. In an example, if the RMS value of the voltage Vinput is relatively low, such a low RMS value can be estimated (e.g., estimated with relatively higher accuracy) by using 40 V for the voltage V1 and 60 V for the voltage V2. In another example, if the RMS value of the voltage Vinput is relatively high, such a high RMS value can be estimated (e.g., estimated with relatively higher accuracy) by using 90 V for the voltage V1 and 110 V for the voltage V2 (although any other appropriate values of the voltages V1 and V2 may be used).

However, the RMS value of the voltage Vinput may not be known when initially selecting the voltages V1 and V2. Accordingly, in an embodiment, the system 10 initially selects 90 V for the voltage V1 and 110 V for the voltage V2, and estimates the voltage Vinput (e.g., using the method 400 of FIG. 4). If the RMS value of the voltage Vinput is estimated to be relatively high, the system 10 does not change the voltage levels of the voltages V1 and V2 (i.e., maintains 90 V for voltage V1 and 110 V for voltage V2).

However, if the RMS value of the voltage Vinput is estimated to be relatively low, the system 10 changes the selection of the voltages V1 and V2. For example, the system 10 re-selects 40 V for the voltage V1 and 60 V for the voltage V2, and re-estimates the voltage Vinput (e.g., using the method 400 of FIG. 4). If the RMS value of the voltage Vinput is in reality relatively low, such a re-selection of the voltages V1 and V2 is used to re-estimate that the RMS value of the voltage Vinput is relatively low with relatively higher level of confidence (e.g., because if the RMS value of the voltage Vinput is relatively low, such low voltage can be estimated with a relatively higher level of confidence by using 40 V for voltage V1 and 60 V for voltage V2).

Figure 5:
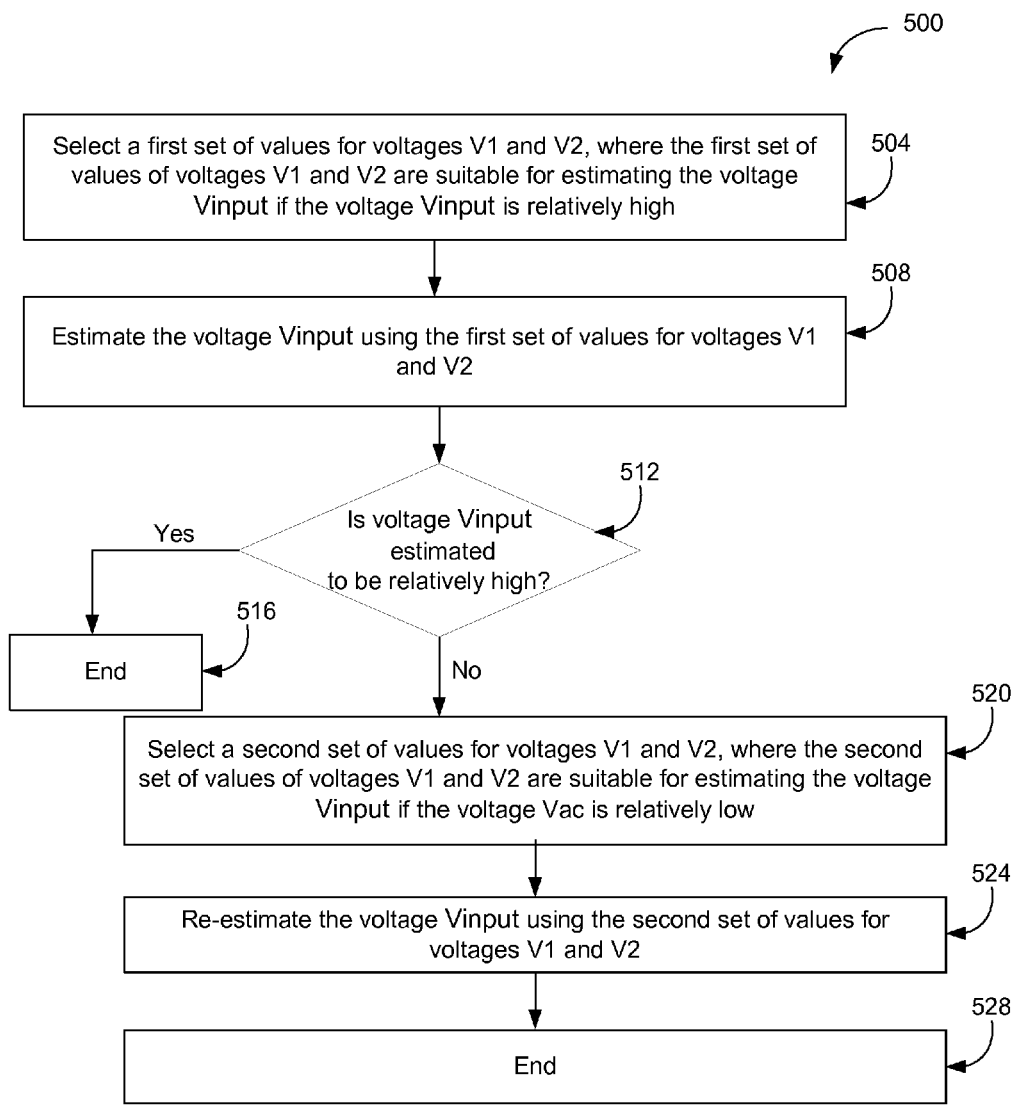
FIG. 5 illustrates an example of a method for selecting various voltages in the system of FIG. 1, in accordance with various embodiments.

FIG. 5 illustrates an example of a method 500 for selecting the voltages V1 and V2 for estimating the voltage Vinput of the power supply 14, in accordance with various embodiments. At 504, a first set of values for the voltages V1 and V2 is selected (e.g., voltages V1 and V2 are selected to be 90 V and 110 V, respectively). The selection of the voltages V1 and V2 can be performed, for example, by a voltage selection module (not illustrated in FIG. 1). The first set of values of the voltages V1 and V2 is suitable for estimating the voltage Vinput if the RMS value of the voltage Vinput is relatively high. At 508, the voltage Vinput is estimated using the first set of values of the voltages V1 and V2 (e.g., in accordance with the method 400 of FIG. 4).

At 512, a determination is made as to whether the estimated RMS value of the voltage Vinput is relatively high. If the estimated RMS value of the voltage Vinput is relatively high (i.e., if Yes at 512), then the method 500 ends at 516. If the estimated RMS value of the voltage Vinput is relatively low (i.e., if No at 512), then at 520, a second set of values for the voltages V1 and V2 is selected (e.g., voltages V1 and V2 are selected to be 40 V and 60 V, respectively). The second set of values of the voltages V1 and V2 is suitable for estimating the voltage Vinput if the voltage Vinput is relatively low. At 524, the voltage Vinput is re-estimated using the second set of values of the voltages V1 and V2. Such a re-estimation is useful, for example, to estimate with a higher level of confidence that the voltage Vinput is relatively low. At 528, the method 500 ends.

Various operations may have been described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description may use the terms "embodiment" or "embodiments," which may each refer to one or more of the same or different embodiments. Furthermore, the terms "comprising," "including," "having," and the like, as used with respect to embodiments, are synonymous.

Although certain embodiments have been illustrated and described herein, it will be appreciated by those of ordinary skill in the art that a wide variety of alternate and/or equivalent embodiments or implementations calculated to achieve the same purposes may be substituted for the embodiments shown and described without departing from the scope. Those with skill in the art will readily appreciate that embodiments may be implemented in a very wide variety of ways. This application is intended to cover any adaptations or variations of the embodiments discussed herein. Therefore, it is manifestly intended that embodiments be limited only by the claims and the equivalents thereof.

What is claimed is:

1. A method comprising:
    receiving a waveform;
    rectifying the waveform to generate a rectified waveform;
    comparing the rectified waveform with a first voltage to generate a first compare signal, wherein a first edge of the first compare signal occurs at a first time when an instantaneous value of the rectified waveform becomes higher than the first voltage;
    comparing the rectified waveform with a second voltage to generate a second compare signal, wherein a first edge of the second compare signal occurs at a second time when the instantaneous value of the rectified waveform becomes higher than the second voltage; and
    based at least in part on the first time and the second time, estimating a voltage of the waveform,
    wherein the first voltage is a direct current (DC) voltage having a first positive value,
    wherein the second voltage is a DC voltage having a second positive value, and
    wherein the first positive value is different from the second positive value.

2. The method of claim 1, wherein estimating the voltage of the waveform further comprises:
    based at least in part on the first time and the second time, determining a voltage estimation factor;
    comparing the voltage estimation factor with a threshold value; and
    based at least in part on comparing the voltage estimation factor with the threshold value, estimating the voltage of the waveform.

3. The method of claim 2, wherein estimating the voltage of the waveform further comprises:
    in response to the voltage estimation factor being higher than the threshold value, estimating that a root mean square (RMS) value of the waveform is lower than a threshold voltage.

4. The method of claim 2, wherein estimating the voltage of the waveform further comprises:
    in response to the voltage estimation factor being lower than the threshold value, estimating that a root mean square (RMS) value of the waveform is higher than a threshold voltage.

5. The method of claim 2, wherein determining the voltage estimation factor further comprises:
    based at least in part on a time difference between the first time and the second time, determining the voltage estimation factor.

6. The method of claim 1, wherein the first edge of the first compare signal and the first edge of the second compare signal are two consecutive edges of the first and second compare signals, such that there is no intermediate edge of either the first or the second compare signals between the first edge of the first compare signal and the first edge of the second compare signal.

7. The method of claim 1, wherein the first voltage and the second voltage are direct current (DC) voltages.

8. The method of claim 1, wherein the waveform is a sinusoidal waveform.

9. The method of claim 1, further comprising:
    based at least in part on estimating the waveform, controlling power to a light emitting diode (LED).

10. A method comprising:
    receiving a waveform;
    rectifying the waveform to generate a rectified waveform;
    comparing the rectified waveform with a first voltage to generate a first compare signal, wherein a first edge of the first compare signal occurs at a first time when an instantaneous value of the rectified waveform becomes higher than the first voltage;
    comparing the rectified waveform with a second voltage to generate a second compare signal, wherein a first edge of the second compare signal occurs at a second time when the instantaneous value of the rectified waveform becomes higher than the second voltage; and
    based at least in part on the first time and the second time, estimating a voltage of the waveform, wherein estimating the voltage of the waveform further comprises
        based at least in part on the first time and the second time, determining a voltage estimation factor,
        comparing the voltage estimation factor with a threshold value, and
        based at least in part on comparing the voltage estimation factor with the threshold value, estimating the voltage of the waveform,
    wherein the voltage estimation factor is a ratio of (i) a time difference between the first time and the second time, and (ii) a period of the waveform.

11. A circuit comprising:
    a rectifier circuit to receive a waveform, rectify the waveform and generate a rectified waveform;
    a first comparison module configured to compare the rectified waveform with a first voltage to generate a first compare signal, wherein a first edge of the first compare signal occurs at a first time when an instantaneous value of the rectified waveform becomes higher than the first voltage;
    a second comparison module configured to compare the rectified waveform with a second voltage to generate a second compare signal, wherein a first edge of the second compare signal occurs at a second time when the instantaneous value of the rectified waveform becomes higher than the second voltage; and a voltage estimation module configured to, based at least in part on the first time and the second time, estimate a voltage of the waveform, wherein the first voltage is a direct current (DC) voltage having a first positive value, wherein the second voltage is a DC voltage having a second positive value, and wherein the first positive value is different from the second positive value.

12. The circuit of claim 11, wherein the voltage estimation module is configured to estimate the voltage of the waveform by:

based at least in part on the first time and the second time, determining a voltage estimation factor;

comparing the voltage estimation factor with a threshold value; and based at least in part on comparing the voltage estimation factor with the threshold value, estimating the voltage of the waveform.

13. The circuit of claim 12, wherein the voltage estimation module is further configured to estimate the voltage of the waveform by:

in response to the voltage estimation factor being higher than the threshold value, estimating that a root mean square (RMS) value of the waveform is lower than a threshold voltage.

14. The circuit of claim 12, wherein the voltage estimation module is further configured to estimate the voltage of the waveform by:

in response to the voltage estimation factor being lower than the threshold value, estimating that a root mean square (RMS) value of the waveform is higher than a threshold voltage.

15. The circuit of claim 11, wherein the first edge of the first compare signal and the first edge of the second compare signal are two consecutive edges of the first and second compare signals, such that there is no intermediate edge of either the first or the second compare signals between the first edge of the first compare signal and the first edge of the second compare signal.

16. The circuit of claim 11, wherein the first voltage and the second voltage are direct current (DC) voltages.

17. The circuit of claim 11, wherein the circuit is included in a control circuit of a light emitting diode (LED).

18. A circuit comprising:

a rectifier circuit to receive a waveform, rectify the waveform and generate a rectified waveform;

a first comparison module configured to compare the rectified waveform with a first voltage to generate a first compare signal, wherein a first edge of the first compare signal occurs at a first time when an instantaneous value of the rectified waveform becomes higher than the first voltage;

a second comparison module configured to compare the rectified waveform with a second voltage to generate a second compare signal, wherein a first edge of the second compare signal occurs at a second time when the instantaneous value of the rectified waveform becomes higher than the second voltage; and a voltage estimation module configured to, based at least in part on the first time and the second time, estimate a voltage of the waveform, wherein the voltage estimation module is configured to estimate the voltage of the waveform by based at least in part on the first time and the second time, determining a voltage estimation factor, comparing the voltage estimation factor with a threshold value, and based at least in part on comparing the voltage estimation factor with the threshold value, estimating the voltage of the waveform, wherein the voltage estimation factor is a ratio of (i) a time difference between the first time and the second time and (ii) a period of the waveform.

19. A method comprising:

receiving a periodically varying waveform;

rectifying the periodically varying waveform to generate a rectified waveform;

selecting a first value for a first voltage and a second value for a second voltage;

based on selecting the first value for the first voltage, comparing the rectified waveform with the first voltage to generate a first compare signal;

based on selecting the second value for the second voltage, comparing the rectified waveform with the second voltage to generate a second compare signal;

based at least in part on the first compare signal and the second compare signal, estimating a root mean square (RMS) value of the periodically varying waveform; and in response to estimating the RMS value of the periodically varying waveform, selecting a third value for the first voltage and a fourth value for the second voltage, wherein the third value is different from the first value, and wherein the fourth value is different from the second value.

20. The method of claim 19, wherein selecting the third value for the first voltage and the fourth value for the second voltage further comprises selecting the third value for the first voltage and the fourth value for the second voltage in response to the RMS value of the periodically varying waveform being estimated to be lower than a threshold value, and wherein the method further comprises:

based on selecting the third value for the first voltage, comparing the rectified waveform with the first voltage to generate a third compare signal;

based on selecting the fourth value for the second voltage, comparing the rectified waveform with the second voltage to generate a fourth compare signal; and based at least in part on the third compare signal and the fourth compare signal, re-estimating the RMS value of the periodically varying waveform.

21. The method of claim 20, further comprising:

in response to the RMS value of the periodically varying waveform being estimated to be higher than the threshold value, refraining from selecting the third value for the first voltage and the fourth value for the second voltage.

22. The method of claim 19, wherein selecting the third value for the first voltage and the fourth value for the second voltage further comprises:

in response to the RMS value of the periodically varying waveform being estimated to be lower than a threshold value, selecting the third value for the first voltage and the fourth value for the second voltage.

* * * * *